United States Patent [19]

Raaijmakers

[11] Patent Number: 5,040,049

[45] Date of Patent: Aug. 13, 1991

[54] SEMICONDUCTOR DEVICE AND METHOD OF MANUFACTURING A SEMICONDUCTOR DEVICE

[75] Inventor: Ivo J. M. M. Raaijmakers, San Jose, Calif.

[73] Assignee: U.S. Philips Corporation, New York, N.Y.

[21] Appl. No.: 449,637

[22] Filed: Dec. 12, 1989

[30] Foreign Application Priority Data

Jan. 4, 1989 [NL] Netherlands ............... 8900010

[51] Int. Cl.⁵ ............... H01L 23/48; H01L 29/46; H01L 29/54; H01L 29/62
[52] U.S. Cl. ................... 357/71; 357/68; 357/65; 357/67
[58] Field of Search .............. 357/68, 71, 65, 67

[56] References Cited

U.S. PATENT DOCUMENTS

| | | | |
|---|---|---|---|
| 4,502,210 | 3/1985 | Okumura et al. | 357/71 |
| 4,871,617 | 10/1989 | Kim et al. | 357/71 |
| 4,897,709 | 1/1990 | Yokoyama et al. | 357/71 R |

Primary Examiner—Andrew J. James
Assistant Examiner—Carl Whitehead, Jr.
Attorney, Agent, or Firm—Paul R. Miller

[57] ABSTRACT

The invention relates to a semiconductor device comprising a silicon body (1) provided with a conductor pattern (4, 5) consisting of a contact layer (4) and an aluminium layer (5). Contact layers (4), such as those of hafnium, titanium and zirconium, are reactive when they are in contact both with silicon and with aluminum. The silicon body (1) is contacted with a conductor pattern (2, 3), which forms a barrier with respect to silicon migration and the conductor pattern (2, 3) is contacted with the aforementioned conductor pattern (4, 5).

10 Claims, 1 Drawing Sheet

SEMICONDUCTOR DEVICE AND METHOD OF MANUFACTURING A SEMICONDUCTOR DEVICE

The invention relates to a semiconductor device comprising a silicon body provided on one side with several layer-shaped conductor patterns, of which at least one conductor pattern is composed of an aluminium layer and an electrically conducting contact layer adjoining the aluminium layer and located between the aluminium layer and the silicon body.

BACKGROUND OF THE INVENTION

A semiconductor device of the kind mentioned in the opening paragraph is known from IBM Technical Disclosure Bulletin, Vol. 18, No. 6, pp. 1845-6 (November 1975), see also Thin Solid Films, Vol. 125, pp. 335-340 (1985).

In the known semiconductor device, the conductor pattern will adjoin the silicon body with the contact layer consisting, for example, of hafnium.

It has been found that such a structure has great imperfections due to formation of pits at the silicon surface and shortcircuit of shallow pn junctions.

The invention has inter alia for its object to avoid these imperfections at least to a considerable extent.

SUMMARY OF THE INVENTION

According to the invention, the semiconductor device of the kind mentioned in the opening paragraph is therefore characterized in that on the one side a surface of the silicon body is adjoined by a first conductor pattern, which forms a barrier for migration of silicon from the silicon body into the conductor patterns, and in that the first conductor pattern is adjoined by a second conductor pattern mentioned above and consisting of the contact layer and the aluminium layer and the contact layer consists of at least one of the elements hafnium, titanium and zirconium.

The invention is based inter alia on the recognition of the fact that the imperfections of the known semiconductor device are due to the direct contact of the contact layer of hafnium, titanium or zirconium with the silicon body on the one hand and with the aluminium layer on the other hand.

The imperfections can be avoided with the use of a first conductor pattern which does not permit any migration of silicon from the semiconductor body.

For the first conductor pattern a wide choice of materials is possible.

Preferably, the first conductor pattern consists of a tungsten layer. One layer is then sufficient.

In another preferred embodiment of the semiconductor device according to the invention, the first conductor pattern consists of a layer containing a titanium compound and a layer containing aluminium. A suitable titanium compound does not give rise to the problems which may occur with elementary titanium.

Preferably, the layer containing a titanium compound consists of a nitrogen-containing titanium-tungsten alloy or a double layer of titanium silicide and titanium nitride.

Preferably, the layer containing aluminium consists of aluminium or an aluminium alloy, for example with silicon, copper or titanium.

Preferably, the contact layer consists of hafnium, which metal gave rise to many problems especially in the known method.

The aluminium layer of the second conductor pattern may also consist of an alloy of aluminium with silicon and/or copper.

Preferably, except the first conductor pattern, all following conductor patterns consist of the combination of a contact layer of hafnium and an aluminium layer.

The invention further relates to a method of manufacturing a semiconductor device, in which one side of a silicon body is provided successively with a contact layer and an aluminium layer adjoining the contact layer, from which layers a layer-shaped conductor pattern is formed.

In the known method, a contact layer of, for example, hafnium is provided on the silicon body and an aluminium layer is provided on this layer. In a usual manner, a pattern of photolacquer is provided on the aluminium layer at the area of the conductor pattern to be obtained. Subsequently, the parts of the aluminium layer not covered by the photolacquer are oxidized anodically.

The hafnium layer then serves to obtain a good electrical contact with the aluminium layer and an oxidation of this layer as complete as possible. Finally, also the hafnium layer can be converted only in part into hafnium oxide by anodic oxidation at the area of the aluminium oxide formed. Therefore, after removal of the pattern of photolacquer, the conductor pattern is subjected to an oxidation treatment at 400° to 550° C. in a moist atmosphere rich in oxygen.

In the last-mentioned treatment, the silicon body may be damaged at the area at which it is in contact with the hafnium contact layer of the conductor pattern. This damage is initiated by reaction of the hafnium with the aluminium, after which the reaction product formed reacts with silicon of the silicon body. As a result, shallow pn junctions are attacked and silicon diffuses from the semiconductor body into the aluminium layer.

In order to counteract this, in the method according to the invention the silicon body is contacted on the side with a first conductor pattern, which forms a barrier for migration of silicon from the silicon body into conductor patterns to be formed, while on the first conductor pattern a second conductor pattern contacting the first conductor pattern is formed, which has been mentioned above and consists of the contact layer and the aluminium layer and a composition is chosen for the contact layer which consists of at least one of the elements hafnium, titanium and zirconium.

By means of the method according to the invention, a silicon body can be obtained having perfect contact points with the first conductor pattern.

The first conductor pattern, which consists, for example, of a tungsten layer or of a composition of a titanium compound and aluminium-containing layers, can be provided in a usual manner, for example by means of plasma etching and, as the case may be, planarization.

The second conductor pattern and any following conductor patterns consisting of the contact layer and the aluminium layer are preferably subjected, after a patterned anodic oxidation of at least the aluminium layer, to an oxidation treatment in an oxygen-containing atmosphere at 400° to 550° C.

In this manner, the conductor pattern is laterally embedded in a completely isolated environment.

This treatment at high temperature may last, for example, from 10 seconds to a few hours.

The second conductor pattern and any following conductor patterns consisting of a contact layer and an aluminium layer have the advantage that they can be formed in a simple and inexpensive manner. The manufacture of integrated circuits with specifications which only apply to given applications is thus possible in a flexible manner.

BRIEF DESCRIPTION OF THE DRAWINGS

The invention will now be described with reference to the accompanying drawing and an embodiment.

In the drawing.

DESCRIPTION OF THE INVENTION

Figure 1:
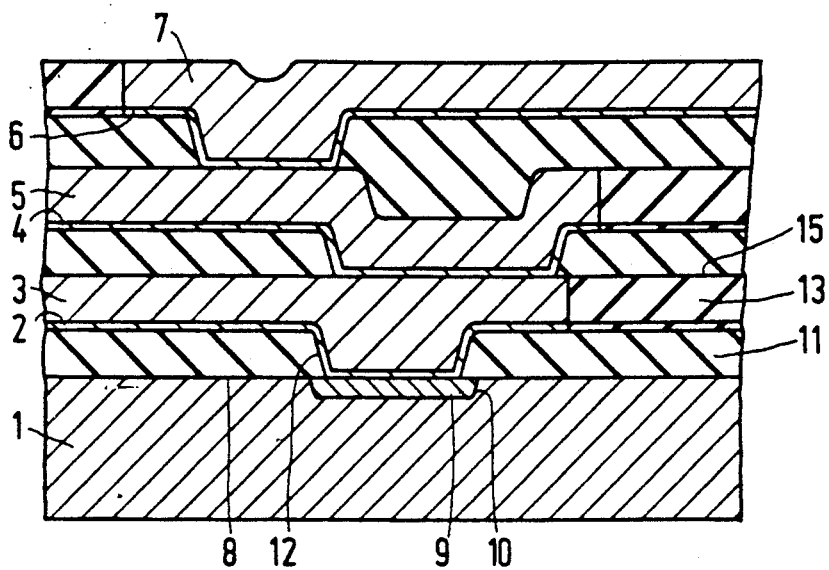
FIG. 1 shows diagrammatically and in sectional view a part of a semiconductor device according to the invention and FIGS. 2 and 3 show diagrammatically and in sectional view a part of a semiconductor device at successive stages of manufacture by means of the method according to the invention.

FIG. 1 shows a semiconductor device comprising a silicon body provided on one side with several layer-shaped conductor patterns (2, 3; 4, 5; 6, 7), of which at least one conductor pattern (4, 5) is composed of an aluminium layer (5) and an electrically conducting contact layer (4) adjoining the aluminium layer (5) and located between the aluminium layer 5 and the silicon body 1.

In known semiconductor devices, the conductor pattern (2, 3) is composed, as the case may be together with the conductor patterns 4, 5 and 6, 7 of a contact layer 2 and an aluminium layer 3.

A contact layer 2 consisting, for example, of hafnium, which is in direct contact with the silicon body 1 and the aluminium layer 3, often gives rise to a strong formation of pits in the silicon body and to attack of shallow pn junctions.

According to the invention, therefore a first conductor pattern 2, 3 forming a barrier for migration of silicon from the silicon body 1 into the first conductor pattern 2, 3 adjoins a side 8 surface of the silicon body 1.

The first conductor pattern 2, 3 is adjoined by a second conductor pattern 4, 5, which, as mentioned above, consists of the contact layer 4 and the aluminium layer 5. In turn the second conductor pattern 4, 5 can be adjoined by a third conductor pattern 6, 7 of the same composition as the second conductor pattern 4, 5.

The contact layers 4, 6 consist of at least one of the elements hafnium, titanium and zirconium, preferably hafnium.

The first conductor pattern 2, 3 consists according to the invention of a homogeneous layer, for example of tungsten, or of, for example, a titanium-containing layer 2 and an aluminium-containing layer 3.

The semiconductor device is manufactured in such a manner that one side of the silicon body 1 is provided with a contact layer 4 and with an aluminium layer 5 adjoining the contact layer 4, a layer-shaped conductor pattern 4, 5 being formed from these layers.

Because of problems of attack of the silicon body 1 in later heat treatments, the step of providing the last-mentioned conductor pattern 4, 5 is preceded by the step of contacting the silicon body 1 on the side with a first conductor pattern 2, 3 which forms a barrier for migration of silicon from the silicon body 1 into the first conductor pattern 2, 3.

Subsequently, a second conductor pattern 4, 5 mentioned above is formed on the first conductor pattern 2, 3 which second pattern contacts the first conductor pattern 2, 3 and consists of the contact layer 4 and the aluminium layer 5.

For the contact layer 4 is chosen a composition consisting of at least one of the elements hafnium, titanium and zirconium.

Figure 2:
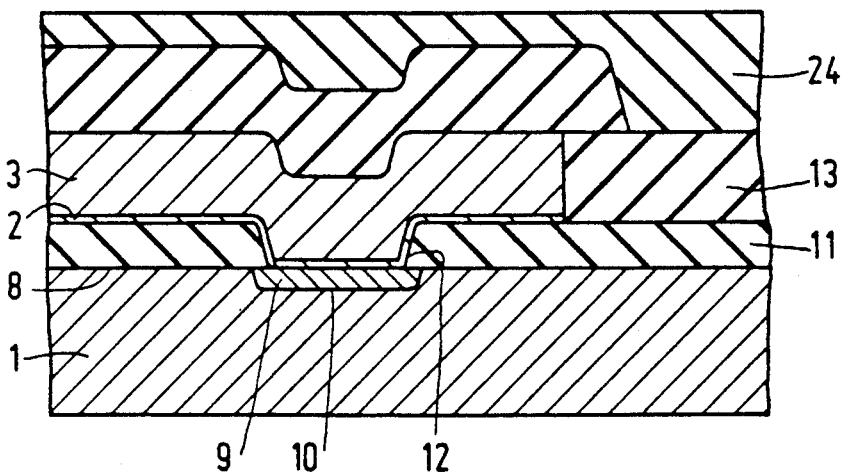

During the manufacture of the semiconductor device according to the invention (see FIG. 2), for example the starting material is a silicon body of the p-conductivity type having an n-type diffusion region 9 and a pn junction 10 located at 0.1 μm from the surface 8.

The region 9 is formed in a usual manner with the use of a 0.6 μm thick silicon dioxide layer 11, into which an opening 12 is etched.

In a usual manner, a nitrogen-containing titanium-tungsten layer 2 is provided in the opening 12 on the surface 8 and on the silicon dioxide layer 11. The layer 2 has a thickness of 0.1 μm. An aluminium layer 3 having a thickness of 0.6 μm is provided on the layer 2.

In a usual manner, the layers 2 and 3 are etched for obtaining the first conductor pattern 2, 3.

Figure 3:
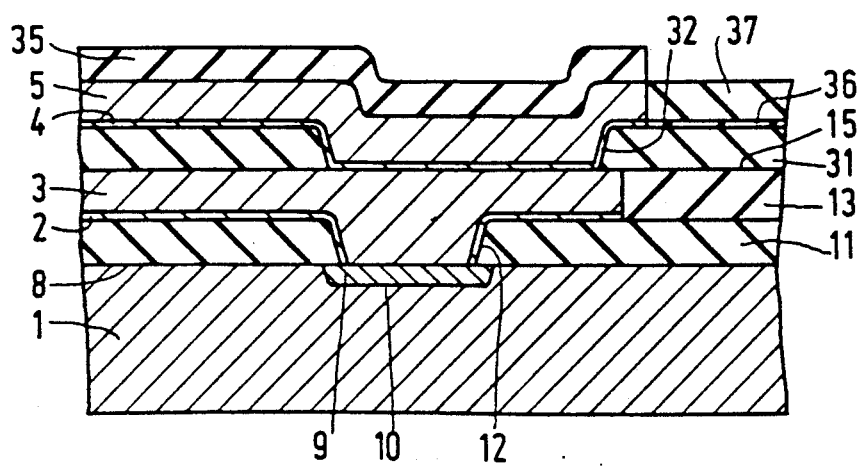

Subsequently, a 0.5 μm thick silicon oxide layer 13 and a flat photolacquer layer 24 are provided, after which the flat surface 15 is obtained by plasma etching in conditions in which photolacquer and silicon oxide and aluminium and silicon oxide, respectively, are etched at the same rate (see also FIG. 3).

In a similar manner as on the surface 8, there is provided on the surface 15 a 0.5 μm thick silicon oxide layer 31, in which an opening 32 is formed.

A 0.02 μm thick contact layer 4 of hafnium and a 1 μm thick aluminium layer 5 are provided in the opening 32 on the surface 15 and on the silicon oxide layer 31.

In a usual manner, the layer 5 is provided with a photolacquer pattern 35, after which the layers 4, 5 are subjected to an anodic oxidation treatment, in which the part 37 of the layer 5 is converted into aluminium oxide. Further, the part 36 of the hafnium layer 4 is partly converted into hafnium oxide.

In order to complete the oxidation of the layer parts 36 and 37, the layers 4 and 5 are subjected to a thermal oxidation treatment for 1 hour in an oxygen-containing atmosphere at 450° C.

As a result, the conductor pattern 4, 5 is formed.

It will be appreciated that a conductor pattern 6, 7 can then be obtained in an analogous manner by formation of an oxide layer on the conductor pattern 4, 5 and, as the case may be, by planarization.

The invention is not limited to the embodiment shown.

For example, the contact layer may consist, instead of hafnium, also of titanium or zirconium. Further, instead of a nitrogen-containing titanium-tungsten alloy for the layer 2 also a double layer of titanium silicide and titanium nitride may be used. It will otherwise be appreciated that within the scope of the invention many variations are possible for those skilled in the art with respect to the details given.

I claim:

1. A semiconductor device comprising
   (a) a silicon body having at least one side
   (b) a first conductor pattern layer adjoining exposed portions of said one side of said silicon body; said first conductor pattern layer forming a barrier to prevent migration of silicon from said silicon body, and (c) at least one second conductor layer pattern disposed on said first conductor pattern layer at a side away from said silicon body, said second conductor layer pattern consisting of a contact layer contacting said first conductor layer pattern and an overlying layer of an aluminum alloy layer disposed on said contact layer, said contact layer being at least one of hafnium, titanium and zirconium.

2. A semiconductor device according to claim 1, wherein said first conductor pattern layer consists of a tungsten layer.

3. A semiconductor device according to claim 2, wherein said contact layer of said at least one second conductor layer pattern consists of hafnium.

4. A semiconductor device according to claim 2, wherein a plurality of second conductor layer patterns are disposed over said first conductor pattern layer, and wherein each of said plurality consists of a hafnium contact layer and an aluminum layer.

5. A semiconductor device according to claim 1, wherein said first conductor pattern layer consists of a first layer containing a titanium compound and a second layer containing an aluminum compound.

6. A semiconductor device according to claim 5, wherein said first layer of said first conductor pattern layer consists of one of a titanium-tungsten alloy containing nitrogen and a double layer of titanium silicide and titanium nitride.

7. A semiconductor device according to claim 6, wherein said second layer consists of one of aluminum and an aluminum alloy.

8. A semiconductor device according to claim 5, wherein said contact layer of said at least one second conductor layer pattern consists of hafnium.

9. A semiconductor device according to claim 5, wherein a plurality of second conductor layer patterns are disposed over said first conductor pattern layer, and wherein each of said plurality consists of a hafnium contact layer and an aluminum layer.

10. A semiconductor device according to claim 5, wherein said second layer consists of one of aluminum and an aluminum alloy.

* * * * *